United States Patent [19]

Lovejoy

[11] 4,377,461
[45] Mar. 22, 1983

[54] TAB PLATER FOR CIRCUIT BOARDS OR THE LIKE

[75] Inventor: Curtis N. Lovejoy, Bristol, Conn.

[73] Assignee: Napco, Inc., Terryville, Conn.

[21] Appl. No.: 305,023

[22] Filed: Sep. 23, 1981

[51] Int. Cl.³ .................... C25D 17/00; C25D 17/06; C25D 17/28
[52] U.S. Cl. ................................. 204/198; 204/224 R; 204/297 W
[58] Field of Search .............. 204/224 R, 198, 297 W, 204/199, 200

[56] References Cited

U.S. PATENT DOCUMENTS

| | | | |
|---|---|---|---|
| 2,101,178 | 12/1937 | Hogaboom | 204/203 |
| 2,651,614 | 9/1953 | Bungay | 204/297 W |
| 4,029,564 | 6/1977 | Higuchi | 204/224 R |
| 4,032,414 | 6/1977 | Helder | 204/15 |
| 4,033,832 | 7/1977 | Sterling | 204/15 |
| 4,155,815 | 5/1979 | Francis | 204/15 |
| 4,186,062 | 1/1980 | Eidschun | 204/15 |

FOREIGN PATENT DOCUMENTS 54-157740 12/1979 Japan .................................. 204/15

Primary Examiner—T. M. Tufariello
Attorney, Agent, or Firm—McCormick, Paulding & Huber

[57] ABSTRACT

The tab plater has holders mounted on trolleys to move planar workpieces through plating heads designed to treat and to plate the lower marginal edges. Each holder includes a vertically oriented work arm and an adjustable bracket which is adapted to clamp the upper edge of each workpiece. Each plating head has a chamber which includes insoluble anode means and nozzle openings communicating with plenum chambers containing electrolyte fluid under pressure to spray the workpieces as they move through the plating head.

10 Claims, 9 Drawing Figures

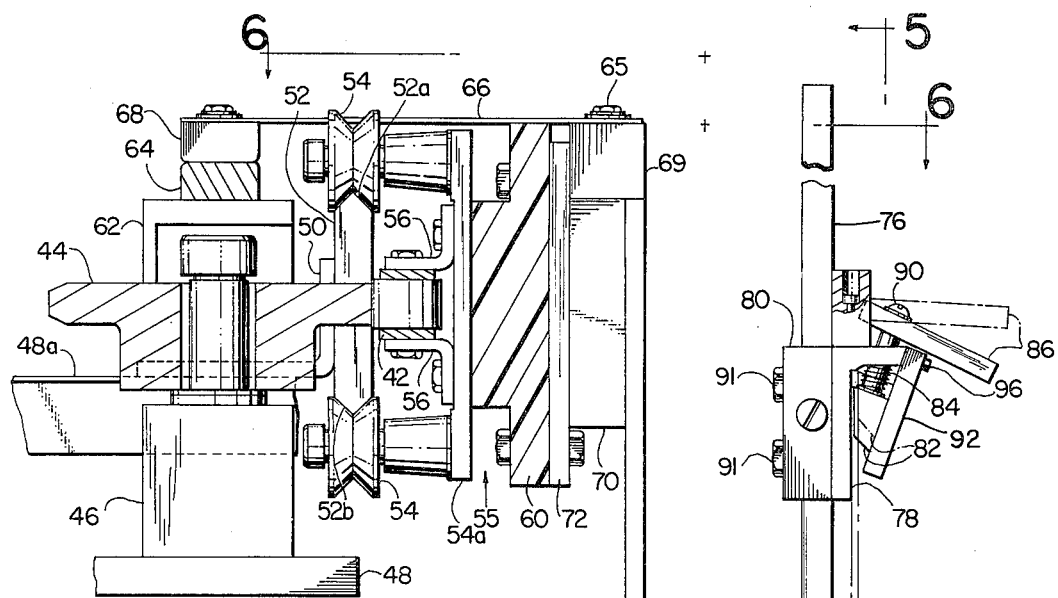
FIG. 4
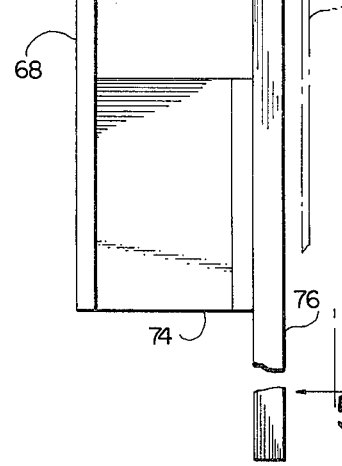
FIG. 9
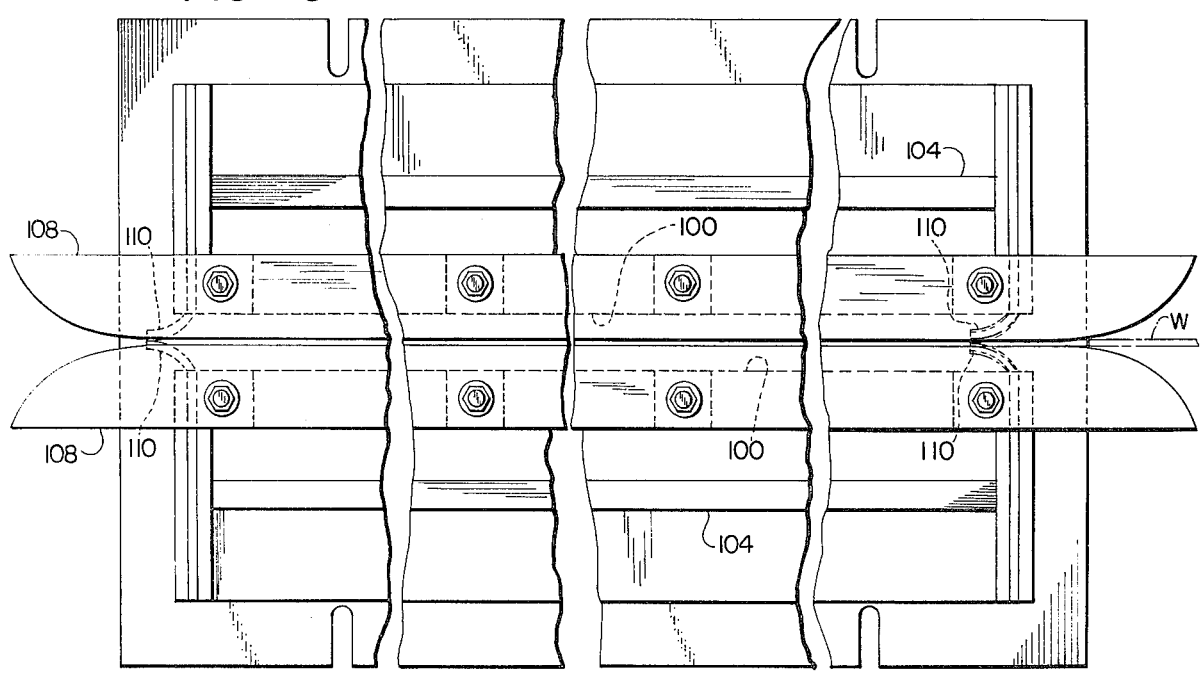

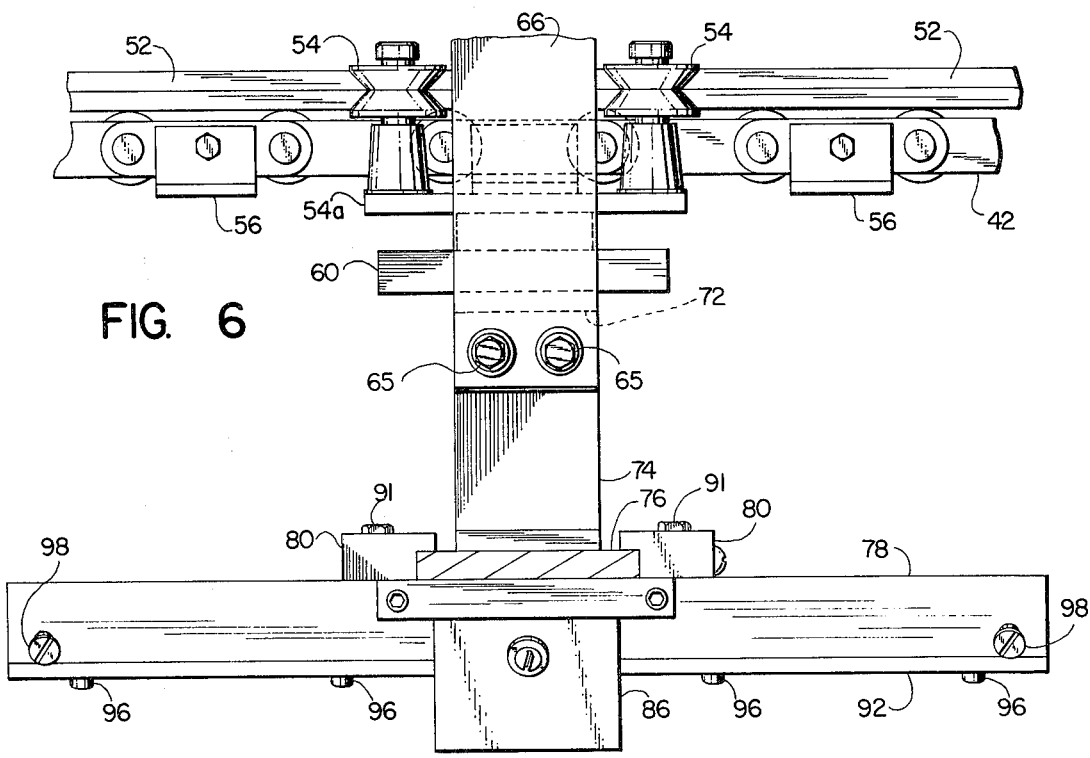
FIG. 6
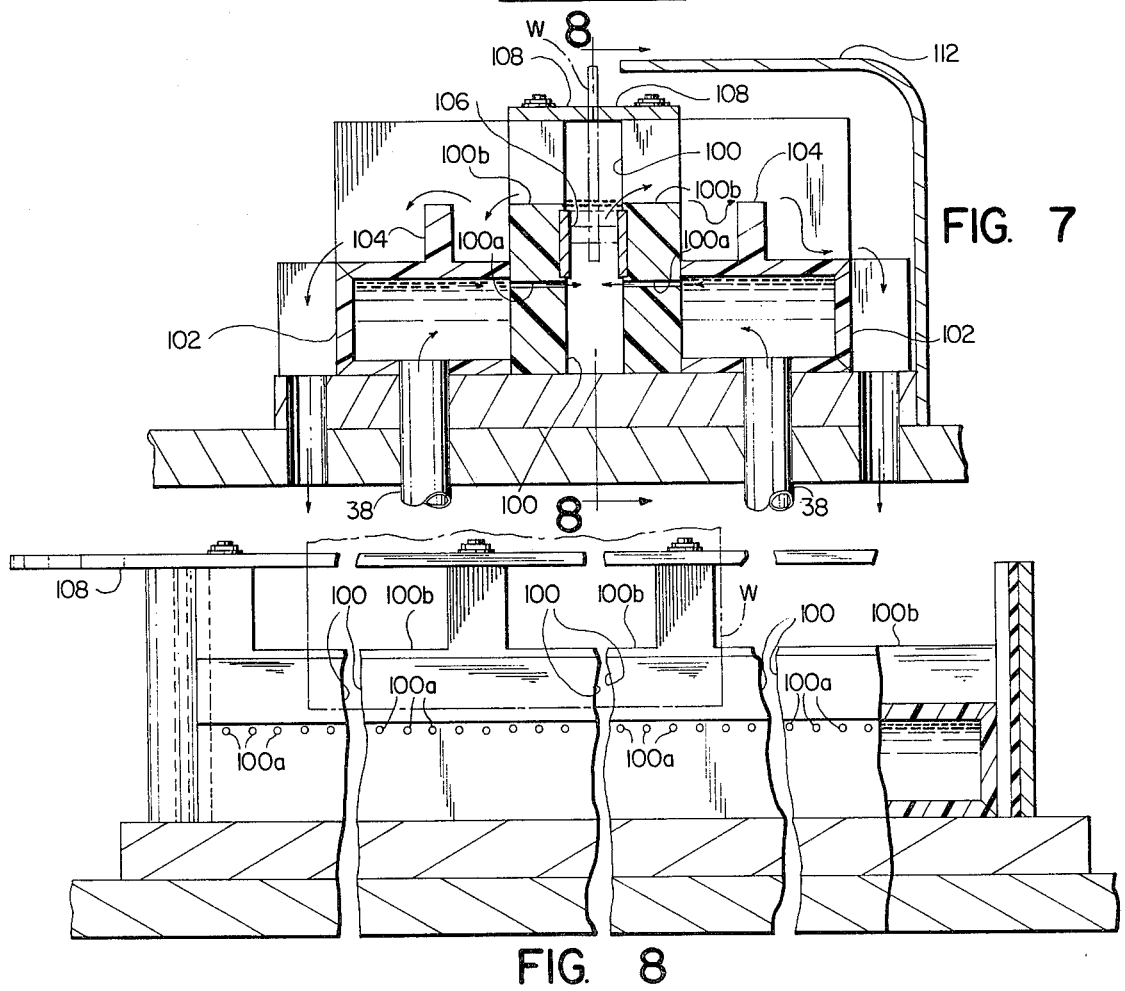
FIG. 7
FIG. 8

TAB PLATER FOR CIRCUIT BOARDS OR THE LIKE

This invention relates generally to continuous electroplating machines for plating the tabs generally provided along one marginal edge of rectangular workpieces such as printed circuitboards, and deals more particularly with improved means for conveying the workpieces in a closed path so that the lower edges of workpieces of different thickness and different rectangular size can be efficiently handled to strip the tab defining areas of the boards of any solder or the like, and to first nickel and then gold plate these tabs in improved plating heads.

The general process for stripping, nickel plating, and gold plating as well as the intermediate washing and drying steps associated with plating the tabs on printed circuitboards is generally well known. Printed circuitboard can vary in thickness and in their rectangular dimensions, but they are generally configured with connectors or tabs defined along one edge, which connectors or tabs normally require nickel and gold plating. The boards, and more particularly these tabs, are generally covered with tin-lead or solder which must first be removed selectively, so that nickel can be applied in thicknesses ranging from 0.00005 to 0.0005 inches, and gold in thicknesses ranging from 0.00003 to 0.0002 inches. These boards are generally used in sophisticated electronic equipment so that the standards for gold plating of the tabs will not tolerate any solder or other contaminates to interfere with the nickel and gold plating in the area of the connections. The boards are generally masked so that the solder is stripped along a definite line of demarcation known as the "mask line". Furthermore, no nickel or gold can be plated above this mask line or this too will necessitate rejection of that particular board. Thus, it is known in the electroplating art to cover portions of a printed circuitboard which should not be plated with masking tape, and then dipping the board to a desired level in a controlled electroplating solution suitably charged with electricity for purposes of nickel plating followed by a gold plating step.

This general dipping method is shown and described in Higuchi et al U.S. Pat. No. 4,029,564. This prior art patent shows a plating head having nozzles for spraying electrolyte against the lower marginal edges of a printed circuitboard. Insoluble anodes are provided in the electrolytic fluid, and actually form the nozzle openings in this particular prior art patent. This prior art patent does not show, however, the capability for moving the boards through the plating head in a continuous fashion, nor does it show or suggest features of the novel plating head to be described wherein upwardly extending sidewalls of the chamber through which the board passes define recesses for receiving the insoluble anodes in such a manner that the boards move with precision between these anodes and through the plating head chamber. The transport mechanism for moving differently sized boards through a plating head such that the area to be plated can be closely controlled in spite of variations in the size of the boards is also an important feature of the present invention as is the holding means disclosed herein for supporting the boards as they follow the closed path defined by the transport mechanism itself.

The prior art also teaches that opposed tracks or belts can be utilized to feed circuitboards through a plating solution in order to strip solder from the unmasked lower edges of the board, and to plate nickel and then gold on these portions of the board without necessity for interrupting the continuous motion of the board through the machine. See for example U.S. Pat. No. 4,186,062 to Eidschen and U.S. Pat. No. 4,155,815 to Francis et al.

U.S. Pat. No. 4,032,414 to Helder et al and U.S. Pat. No. 4,033,832 to Sterling et al show plating workpieces to a desired depth without necessity for masking.

The present invention has for one of its principal objects the capability of handling printed circuitboards of different thickness and size in a continuous tab plating machine which avoids the need for endless tractor treads to capture the boards therebetween in order to move them through the machine. Another object of the present invention is to provide a high speed conveyorized electroplating machine for the tab portion of a typical circuitboard wherein the board is fed through the entire stripping, cleaning, activation, plating and rinse cycles without necessity for raising and lowering the board.

Still another object of the present invention is to provide a novel clamping means for each of the circuitboards such that boards of different height can be accommodated and so that each board is rendered electrically conductive when required for the nickel and gold plating of the tabs along its lower edge.

The present invention realizes the above mentioned advantages in a plating machine which includes a fixed frame for supporting the various rinsing and plating tanks required to treat and to plate the circuitboards as they are transported by a conveyor. A superstructure of the frame supports the conveyor so that the boards move horizontally and longitudinally in their own plane through a plating station provided above the tank or reservoir containing the electrolytic solution. Each plating station includes a plating head provided in the path of the lower marginal edges of these workpieces and each plating head includes sidewalls defining an upwardly open chamber through which these workpiece edges are adapted to move. Longitudinally extending insoluble electrodes are provided on either side of the plating head chamber and these electrodes are preferably recessed in the chamber sidewalls. Fluid filled plenums for storing a quantity of the electrolyte under pressure are located behind these chamber sidewalls and pumping means serves to maintain these plenums in this condition. Nozzle openings in the chamber sidewalls are provided with electrolyte under pressure to spray into the area to be plated, and the upwardly open chamber fills with agitated electrolytic fluid to the level of overflow or return openings provided above the insoluble anode openings in the chamber sidewalls. End walls for the plating head are defined by inwardly projecting rubber dams which are normally closed against one another but which will move apart in response to motion of the circuitboard therebetween.

The transport conveyor comprises a single chain supported in the frame superstructure and movable in a closed path with trolleys mounted to spaced locations on the chain and a trolley track adjacent to the chain for guiding the trolley during its motion. Workpiece holders are provided on the trolley and each trolley includes a vertically oriented work arm such that a workpiece carrier is provided in adjustable relation to an arm by means of a clamping bracket adapted to secure the upper marginal edge of each workpiece or circuitboard to the trolley for passage through the plating station.

FIG. 3 is taken generally on the line 3—3 of FIG. 2.

FIG. 4 is a vertical sectional view to a larger scale than that of of FIG. 3 and illustrates the transport chain, trolley and workpiece holder mechanism in greater detail.

FIG. 6 is a horizontal sectional view taken generally on the line 6—6 of FIG. 4.

FIG. 7 is a vertical sectional view of one version of a plating head provided at each of the plating stations in FIG. 3 but is drawn to a considerably larger scale to illustrate certain details of the chamber through which the circuitboard is moved while being plated.

FIG. 8 is a vertical sectional view taken generally on the line 8—8 of FIG. 7 with a portion of the chamber sidewall broken away to reveal the plenum.

FIG. 9 is a plan view to illustrate the upstream and downstream end portion of the plating head.

Figure 1:
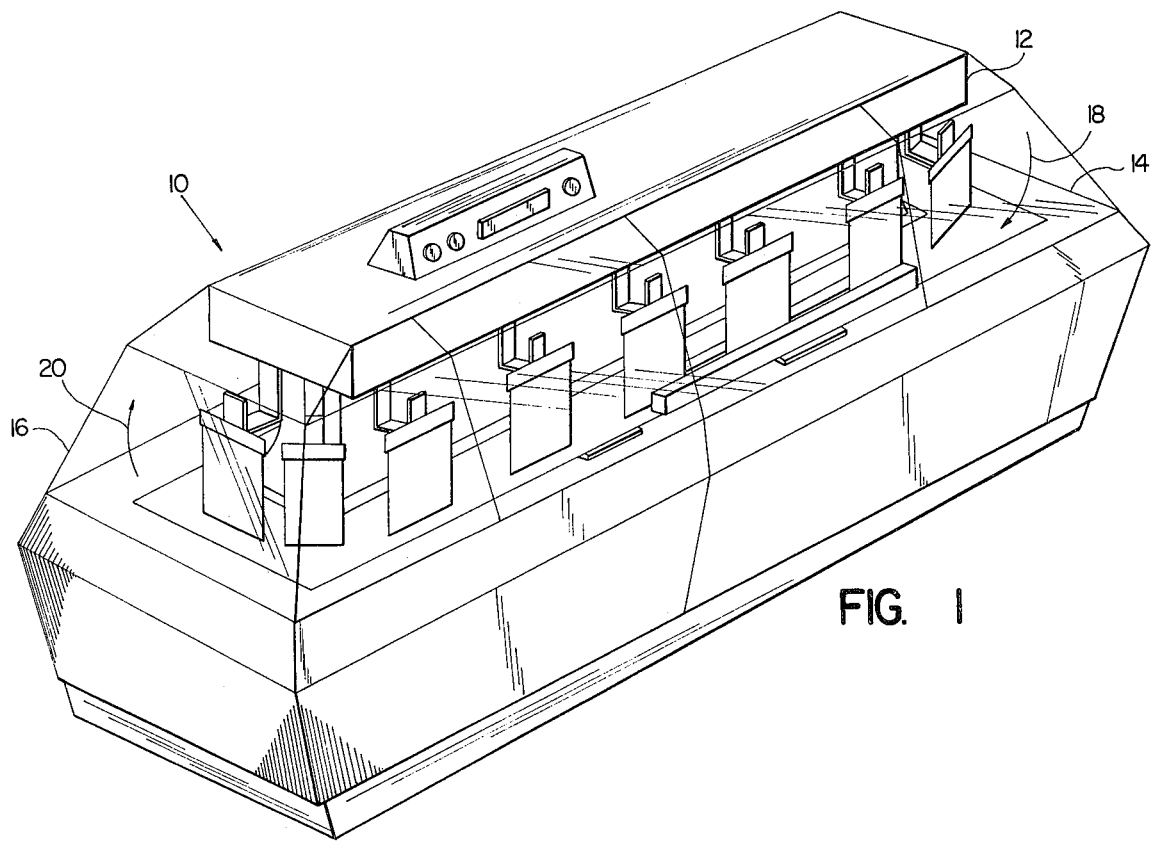
FIG. 1 is a perspective view of a continuous, automated plating machine for the tabs of printed circuitboards constructed in accordance with the present invention and having a plurality of stations illustrating the overall cabinet structure which encloses the elements of the plating machine.

Turning now to the drawings in greater detail, and referring particularly to the perspective view of FIG. 1, an elongated cabinet structure 10 includes a fixed frame, to be described, which frame includes a superstructure housing an endless conveyor chain inside a rectangular enclosure 12. The somewhat larger base portion 14 of the cabinet 10 comprises a series of opaque panels hung on a tubular frame to be described, and an intermediate series of transparent panels 16 extend between the upper rectangular portion 12 and the lower base protion 14 complete the cabinet construction. The panels 16 are removable, and the operator can remove one or more panels at the right hand end of the machine in order to load circuitboards to be plated and to unload circuitboards after they have traversed the closed path mentioned previously and have been suitably plated.

Figure 2:
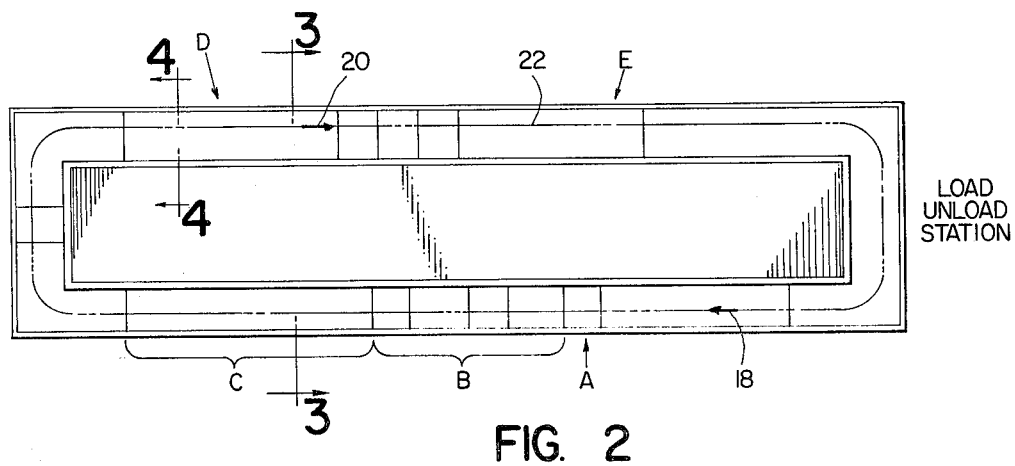
FIG. 2 is a plan view of the various machine stations.

The direction of motion of the circuitboards around the apparatus of FIG. 1 is suggested by the arrows 18 and 20, and the load/unload station is provided at one end of the machine, preferably the right-hand end as suggested in FIG. 2.

With particular reference to FIG. 2 circuitboards are adapted to be loaded at the right-hand end as mentioned, and to traverse the path indicated generally by the phantom line 22, and to travel in the direction indicated by the arrows 18 and 20. After being hung on holders suspended from a conveyor to be described, the boards or workpieces move first through a solder stripping tank A where the previously plated solder material is stripped away from the lower marginal edges of the boards to expose the previously plated tab or electrical connection portions. Each board will have been masked with a suitable tape such as an adhesive/masking tape and it is a feature of the present invention that the boards travel in a horizontal path around the machine as suggested by the line 22 without necessity for raising and lowering the boards and without necessity for opposed belts to drive the boards around this path.

The workpieces or boards are then subjected to a series of rinsing and scrubbing operations to assure that the solder and other impurities are removed from the surfaces to be nickel plated in the tank designated generally at C. As mentioned previously these boards are generally nickel plated prior to the application of the final gold plate, and the plating heads for accomplishing both the nickel plating and the gold plating will be described in greater detail hereinbelow.

At the left-hand end of the machine the boards are subjected to a further rinse cycle and preferably pass through an activator tank prior to moving through the gold plating tank indicated generally at D. After gold plating the boards are subjected to conventional drag out and gold reclaiming stations following which the boards are rinsed and ultimately dried at the station generally designated at E. These boards are continuously moved at a constant rate of speed through the machine along the line designate generally at 22 and are adapted to be manually unloaded at the right hand of the machine which comprises the load and unload station.

Figure 3:
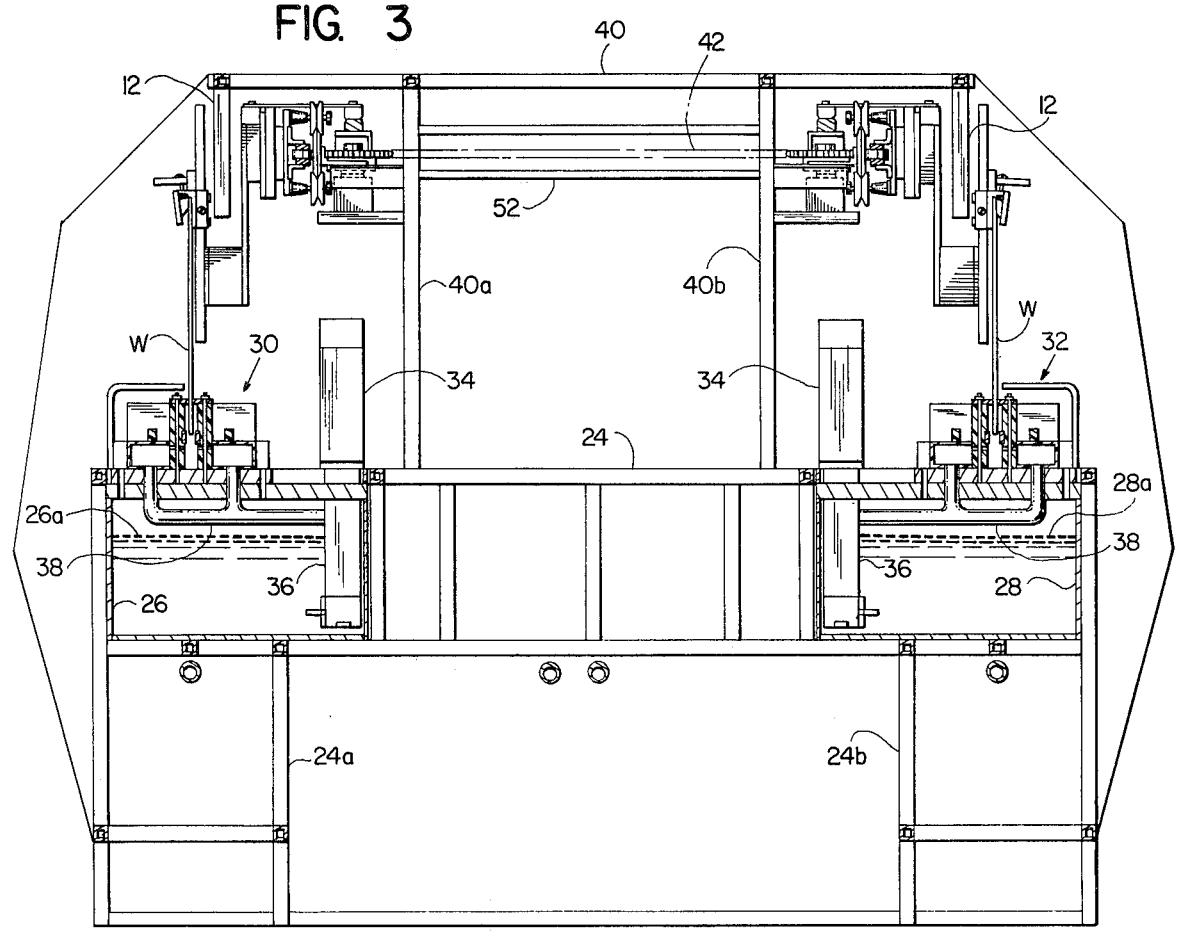
FIG. 3 is a transverse cross sectional elevational view through the nickel plating and gold plating stations of the machine of FIG. 1, illustrating the base of the machine frame together with the superstructure for supporting the transport conveyor chain and its associated trolleys and individual workpiece holders or carriers.

FIG. 3 shows the makeup of the machine frame in vertical section, and shows the gold plating station at the left-hand side of FIG. 3 and the nickel plating station at the right-hand side (See sectional line 3—3 in FIG. 2). The machine frame is made up from tubing of generally square cross section and comprises a base 24 for supporting various rinsing and plating tanks or reservoirs at a convenient height above the floor. Leg portions 24a, 24b of the frame base 24 are provided below the tanks. More particularly, the plastic reservoir or tank 26 contains gold plating solution to a depth indicated generally at 26a in FIG. 3. Nickel plating solution is provided to a depth 28a in the tank 28 on the opposite side of the machine frame. Plating heads are provided on top of these reservoir tanks 26 and 28 and in the path of movement for the circuitboards to be plated. The gold plating head is indicated generally at 30 in FIG. 3 and the nickel plating head at 32. Each plating head 30 and 32 receives plating solution from the fluid contained in the reservoir or tank therebelow as a result of identical fluid pumping structures in the form of pumps 36 and motors 34 so that fluid under pressure is provided in the conduits 38, 38 to each of these plating heads 30 and 32. The plating heads themselves will be described in greater detail hereinafter.

Still with reference to FIG. 3, the machine frame includes a superstructure portion 40 supported from the base 24 on uprights 40a, 40b. The top of this superstructure frame 40 supports the depending panels 12 mentioned previously and a workpiece transport conveyor chain 42 is entrained on sprockets supported for rotation adjacent the corners of the cabinet superstructure so that the chain is adapted to move in a closed path around the plating machine and to thereby define the closed path for the workpieces W to be plated. These workpieces are individually supported on trolleys associated with the conveyor chain 42 by means of a U-shaped workpiece holder to be described in greater detail hereinbelow. These workpiece holders are adapted to clamp the upper marginal edge of each workpiece W so that a depending portion of the workpiece follows a predetermined path located in predetermined relationship to the closed path for the conveyor chain. As so constructed and arranged the plating heads 30 and 32 are adapted to provide electrolyte at a predetermined height regardless of the dimensions of the workpiece W to be plated.

Turning next to a detailed description of FIG. 4, the view of FIG. 4 is a vertical section similar to that of FIG. 3 but taken through one of the sprockets 44 around which the transport conveyor chain 42 is entrained. The sprocket 44 shown is supported for rotation on a vertical axis in a bearing block 46, which block is in turn supported in the superstructure of the frame as indicated generally at 48 in FIG. 4. The superstructure 48 includes an additional member 48a having an angle bracket 50 mounted thereto for supporting a polypropylene plastic track 52. This track 52 is arranged parallel to the chain 42 and has upper and lower edges 52a and 52 b for engaging concave upper and lower rollers 54, 54. These rollers are mounted on stub shafts associated with a trolley 55 and more particularly to a back plate 54a which also includes brackets 56 for connecting the trolley to the chain 42. The plate 54a may be of electrically conductive metal and a second plate 60 is preferably fabricated from polypropylene plastic and is attached to the metal plate 54a so that the U-shaped work holder structure can be insulated from, but carried by the trolley. The work holder is fabricated of electrically conductive metal which is nevertheless insulated from the metal chain 42 by the plastic plate 60.

In order to provide electricity, selectively, to the U-shaped work holders, the frame superstructure 48a has insulators 62 mounted thereto and supporting an elongated bus bar 64. The trolley structure and more particularly the U-shaped work holder itself, has a conductor arm 66 mounted to it as shown at 65. The free, or cantilever end portion of the arm carries a shoe 68 such that the trolley can pickup electricity from the fixed bus bar 64 at selected locations along the path of movement for the trolley as it is carried around the machine by the chain 42. The shoe 68 is electrically connected to the cantilever arm 66 and the resiliency of the arm 66 is sufficient to urge the shoe 68 into contact with the bus bar 64 as required to pickup electricity therefrom and to provide a source of electrical energy to the workpiece W held in the U-shaped holder.

Turning next to a detailed description of the work holder or carrier, FIG. 4 shows this component as including a generally U-shaped support bracket for the workpiece W and to include a vertically extending leg 68 attached to the plastic backplate 60 by means of a spacer 70 and intermediate metal plate 72. The leg 68 has a metal block 69 which serves to electrically connect the pickup arm 66 to the workpiece holder and hence to the cathode or workpiece. The base of the U 74 also comprises a spacer element and the other leg of the U, 76, comprises a vertically oriented work holder arm which is adapted to slidably support a cross arm structure 78 in which the upper marginal edge of the board or workpiece W is adapted to be clamped. Bracket means 80 is provided for mounting the cross arm 78 to the vertically oriented workpiece holder arm 76 and the actual clamping means for the workpiece comprises a camming bar 82 movably mounted in the cross arm structure together with biasing means in the form of compression springs 84, 84 to urge the camming bar downwardly and into clamping contact with the upper marginal edge of the workpiece W as shown. An operating lever 86 is pivotally connected to the cross arm 88 so that an elongated fastener 90 provided in the operating lever extends through an opening provided for this purpose in the cross arm structure and thence through one coil compression spring 84 into the camming bar as shown in FIG. 4.

Figure 5:
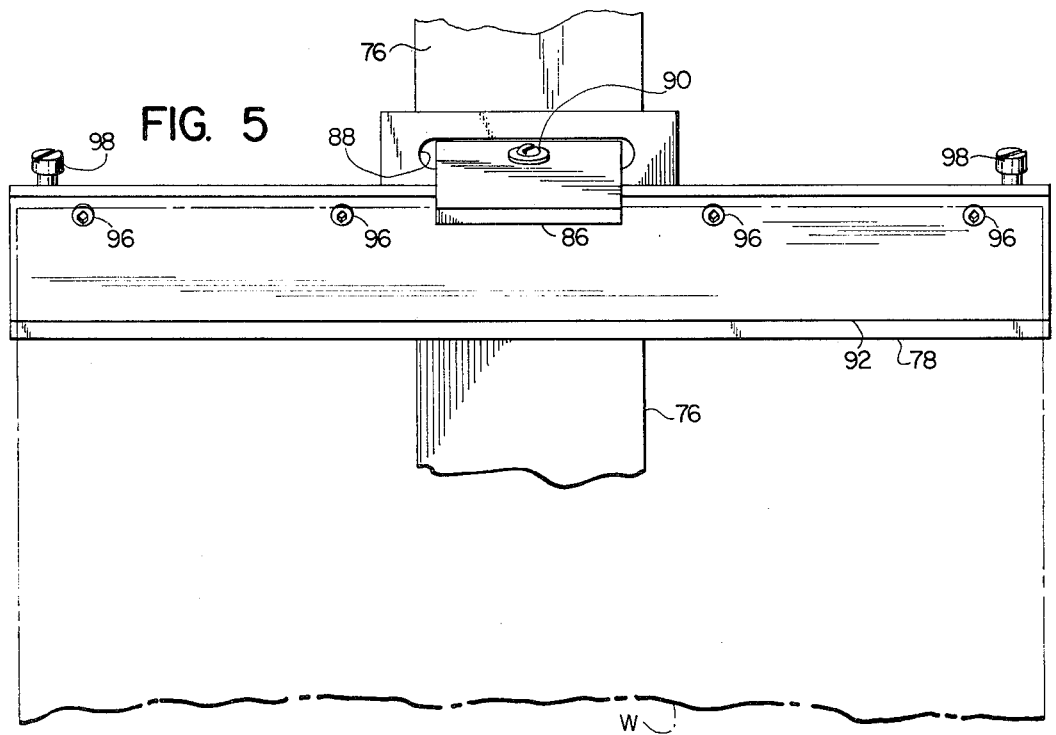
FIG. 5 is a vertical sectional view taken on line 5—5 of FIG. 4.

Two additional screws 98, 98 serve to maintain the bar 82 in alignment with the cross arm structure as best shown in FIG. 5. Each of these screws 98 and 98 has a compression spring 84 acting on the camming bar.

As so constructed and arranged the operating lever 86 can be moved from the solid line position shown to the broken line position as a result of pivoting about its inner end in a notch 88 provided for this purpose in the cross arm structure, as indicated generally at 88 in FIG. 5. Movement of the operating lever in this direction will release the workpiece W so that it can be downwardly removed from the clamping means. A manual force will be required to move the operating lever in this direction in order to overcome the biasing force of the compression springs 84, 84. The bracket means 80 for securing the cross arm structure to the vertical arm 76 is clamped in a predetermined vertical position to accommodate workpieces of a predetermined height and to provide the desired degree of penetration for the lower edge of the workpiece into the plating heads referred to previously. Loosening screw fasteners 91, 91 will permit the machine operator to adjust the bracket means 80 to the desired height for the vertical arm 76 for this purpose.

It will be apparent from FIG. 4 that the lower edge of the workpiece W or circuitboard is thereby provided in predetermined relationship, both vertically and horizontally, with respect to the path of motion for the conveyor chain 42. The configuration of the U-shaped work holder together with the vertical adjustability for the workpiece clamping means will permit the lower edge of the circuitboard to be so located that the marginal edges to be plated will pass through the plating heads 30 and 32 and be immersed in the solution to a predetermined depth. FIGS. 5 and 6 show the cross arm clamping structure and U-shaped holder with FIG. 6 also illustrating in plan view a portion of the apparatus of FIG. 4. As shown in FIG. 4 the electrical connecting bar 66 serves to electrically connect the U-shaped work holder as described above to the shoe 68 and bus bar 64.

Still with reference to the cross arm structure 78 an angle bracket is attached to bracket means 80, 80 and a plate 92 is secured to this bracket by screws 96, 96. The rear face of plate 92 serves as an inclined surface for slidably receiving the camming bar 82. The screws 98, 98 are oriented parallel to the screw 90 and each screw 98 carries a spring similar to the spring 84 for purposes of biasing the camming bar 82 at its end portions as well as the mid-portion thereof in order to achieve uniform motion of the camming bar in response to operation of the operating lever 86.

Turning next to a more detailed description of the plating head illustrated in FIG. 3, as noted previously each of the plating heads is similar in construction to the other and only one will be described in detail with reference to FIGS. 7, 8 and 9. FIG. 7 shows the circuitboard W, and more particularly the lower portion thereof, and illustrates the board W in the process of being plated along its lower marginal edge as a result of moving through the upwardly open chamber defined by sidewalls 100, 100. These sidewalls 100, 100 extend the full length of the plating head, that is the full length of the electroplating station as suggested in FIG. 8. However the underlying reservoir or tank may extend beyond the ends of the plating head and it is a feature of the present invention that the plating head is somewhat narrower in width than the top of the reservoir or tank, as suggested in FIG. 3, in order to provide a path for the free flow of return fluid from the plating head back to the reservoir. Means is provided for delivering electrolytic fluid under pressure to nozzle openings 100a in the chamber sidewalls 100 and said means preferably comprises a plenum 102 defined rearwardly of each sidewall 100. A conduit 38 connects the plenum 102 to the outlet side of the pump 36 as shown in FIG. 3.

As so constructed and arranged electrolytic fluid under pressure is provided to the plenum 102 and flows in the direction of the arrows shown in FIG. 7 through the nozzle openings 100a. FIG. 8 shows these nozzle openings as a longitudinally extending line of similarly sized openings providing a path for the flow of high pressure eletrolytic fluid from the plenum 102 to the chamber defined between the sidewalls 100, 100. Thus, fluid moves into the chamber defined between these sidewalls causing the chamber to fill to a level which is dictated by the lower edge 100b of return openings through which the eletrolytic fluid can flow into overflow chambers defined by longitudinally extending walls 104, 104 defined for this purpose in the upper surface of the top of plenum 102. When these overflow chambers have become filled with fluid, the fluid will overflow the upper edge of these walls 104 and ultimately return to the tank or reservoir as suggested by the arrows in FIG. 7.

FIG. 8 shows the return openings as being considerably larger in cross sectional size than the nozzle openings 100a through which the electrolytic fluid moves under pressure to fill the chamber defined between the sidewalls 100 and 100. The insoluble anode bars 106, 106 preferably comprise platinized titanium members which fit in the recesses provided in the sidewalls 100, 100. The lower marginal edge portion of the workpiece W to be plated does not come in contact with the bar 106, but is provided in closely spaced relationship thereto so that the agitated electrolytic fluid therebetween will carry metal ions for deposit on the workpiece W in a uniform plating operation superior to that achieved in prior art systems generally. Guide plates 108, 108 provide stability for the circuitboards W, W as a result of forming a relatively narrow passage for the boards (see FIG. 9) during movement through the plating head chamber. A guard 112 may be provided as suggested in FIG. 7 to prevent the electroplating solution from splashing outwardly as it cascades down through openings in the top of the reservoir.

Finally, and still with reference to the plating heads 30 and 32, FIG. 9 illustrates the construction for the end walls of the plating heads and reveals how the level of electrolytic fluid in the upwardly open chamber defined between the sidewalls 100, 100 can be achieved in spite of the fact that the workpiece W moves only longitudinally and horizontally through this chamber. Each end wall includes laterally inwardly projecting elastomeric dams which are normally closed against one another as illustrated at 110, 110 in FIG. 9. As the circuitboard W moves longitudinally between these elastomeric dams 110, 110 they will part to allow passage of the board, as indicated generally at the right-hand side of FIG. 9. These rubber dams 110, 110 will remain in contact with the exterior surface of the board W until the board has been received in the electroplating chamber. The chamber is much longer than the longitudinal dimension of the board W as suggested in FIG. 8. The board W will leave the electroplating head through the elastomeric dams 110, 110 at the left-hand end of the plating head in a similar manner. The circuitboard workpiece W is connected to one side of a DC rectifier system, and the other side of the rectifier system is electrically connected to insoluble anode bars 106, 106 which bars are provided in recesses arranged for this purpose in the innerfaces of the sidewalls 100 and 100.

I claim:

1. In a plating machine which includes a frame for supporting the various rinsing and plating tanks required for treating and plating depending portions of planar workpieces, the improvement comprising a workpiece transport conveyor chain supported in a superstructure portion of said frame for movement around a closed path, trolleys mounted to spaced locations on said chain, a trolley track adjacent said chain, each trolley having upper and lower rollers engaging said trolley track, workpiece holder means mounted to said trolley and including a vertically oriented work arm, a workpiece carrier adjustably mounted on said work arm and including means for clamping an upper marginal edge of a workpiece so that a depending portion of the workpiece follows a predetermined path located in predetermined relationship to said closed path of said conveyor chain means for connecting said workpiece carrier to a source of electrical potential, said connecting means including a bus bar mounted to the machine frame superstructure portion adjacent a portion of said closed conveyor chain path and a cantilevered electrical pick-up assembly mounted to said trolley and including a free end adapted to engage said bus bar and a clamped end adapted to be connected to said workpiece holder means, said trolley being constructed in two parts, one trolley part having said rollers and being so mounted to said chain, said trolley having another part electrically insulated from said one part and supporting said holder means.

2. The combination of claim 1 wherein said workpiece carrier comprises a cross arm oriented horizontally and having a rear face for engaging said vertically oriented work arm, bracket means for mounting said cross arm to said work arm, and said workpiece clamping means including a workpiece camming bar movably mounted in said cross arm and biasing means to urge said camming bar toward the front face of said cross arm to clamp a workpiece therebetween.

3. The combination of claim 2 wherein said cross arm includes a front plate spaced from said front face and defining an inclined surface for slidably receiving said camming bar.

4. The combination of claim 3 further characterized by an operating lever pivotally connected to said cross arm and coupled to said camming bar to facilitate the release of a workpiece by the application of a manual force to said lever to overcome the force of said biasing means.

5. In a plating machine which includes a superstructure for supporting a transport conveyor of the type which is adapted to support generally flat planar workpieces for movement along a predetermined path, at least a portion of such path being horizontal and longitudinal and in the plane of the workpieces to be plated, the improvement to the plating station of such a machine comprising:

(a) fluid reservoir means below the path of the workpieces for holding a quantity of the fluid electrolyte, (b) a plating head provided in the path of the lower marginal edges of the workpieces and including sidewalls defining an upwardly open chamber through which these workpiece edges are adapted to move, (c) longitudinally extending insoluble electrode bars provided on either side of said plating head chamber and received in recesses in said sidewalls of said chamber so that the workpieces do not touch said bars during horizontal longitudinal movement of said workpieces, (d) a fluid plenum for the electrolyte and located behind said chamber sidewalls, (e) fluid pumping means to provide electrolyte to said plenum from said reservoir means, (f) nozzle openings in said chamber sidewalls to provide electrolyte to fill said chamber from said plenum, and (g) fluid return openings in said sidewalls to return fluid to said reservoir means once said chamber has been filled to a predetermined height above said insoluble electrode bars whereby the workpiece marginal edges are adapted to be plated as they move through the electrolyte filled portion of said chamber below said return openings.

6. The combination of claim 5 wherein said plating head further includes end walls for said chamber, said end walls comprising laterally inwardly projecting elastomeric dams which are normally closed against one another and which move apart in response to motion of the workpiece between them in the longitudinal direction.

7. A plating machine for treating and plating depending portions of flat planar workpieces and comprising:

(a) a frame including a base and a superstructure portion, (b) a workpiece transport conveyor chain supported in said superstructure portion and moveable in a closed path above a peripheral portion of said base, (c) fluid reservoir means provided in said frame base below said path and adapted to contain an electrolyte, (d) trolleys mounted to spaced locations on said chain, (e) a trolley track adjacent said chain, (f) each trolley having upper and lower rollers engaging said trolley track, (g) workpiece holder means mounted to said trolley and including a vertically oriented work arm, a workpiece carrier adjustably mounted to said work arm and including means for clamping an upper marginal edge of a workpiece, (h) a plating head provided above said reservoir means and in the path of the lower marginal edges of the workpieces so held in said clamping means, (i) said plating head having sidewalls defining an upwardly open chamber to receive these marginal lower edges, (j) longitudinally extending insoluble electrode bars provided in recesses in said walls so that the workpieces do not touch said bars during longitudinal movement between said sidewalls of said chamber, (k) a fluid filled plenum for the electrolyte and located behind sid chamber sidewalls, (l) fluid pumping means to provide electrolyte to said plenum from said reservoir means, (m) nozzle openings in said chamber sidewalls to provide electrolyte to fill said chamber from said plenum, (n) fluid return openings in said sidewalls to return fluid to said reservoir means once said chamber has been filled to a predetermined height above said insoluble electrode bars whereby the workpiece marginal edges are adapted to be plated as they move through the fluid filled portion of said chamber below said return openings means for connecting said workpiece carrier to a source of electrical potential, said connecting means including a bus bar mounted to the machine frame superstructure portion adjacent a portion of said closed conveyor chain path and a cantilevered electrical pick-up assembly mounted to said trolley and including a free end adapted to engage said bus bar and a clamped end adapted to be connected to said workpiece holder means, said trolley being constructed in two parts, one trolley part having said rollers and being so mounted to said chain, said trolley having another part electrically insulated from said one part and supporting said holder means.

8. The combination of claim 7 wherein said workpiece carrier comprises a cross arm oriented horizontally and having a rear face for engaging said vertically oriented work arm, bracket means for mounting said cross arm to said work arm, and said workpiece clamping means including a workpiece camming bar movably mounted in said cross arm and biasing means to urge said camming bar toward the front face of said cross arm to clamp a workpiece therebetween.

9. The combination of claim 8 wherein said cross arm includes a front plate spaced from said front face and defining an inclined surface for slidably receiving said camming bar.

10. The combination of claim 7 wherein said cross arm includes a front plate spaced from said front face and defining an inclined surface for slidably receiving said camming bar.

* * * * *